(12) United States Patent
Dawson et al.

(10) Patent No.: US 9,285,404 B2
(45) Date of Patent: Mar. 15, 2016

(54) TEST STRUCTURE AND METHODOLOGY FOR ESTIMATING SENSITIVITY OF PRESSURE SENSORS

(71) Applicant: FREESCALE SEMICONDUCTOR, INC., Austin, TX (US)

(72) Inventors: Chad S. Dawson, Queen Creek, AZ (US); Peter T. Jones, Scottsdale, AZ (US); Bruno J. Debeurre, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 292 days.

(21) Appl. No.: 13/967,877

(22) Filed: Aug. 15, 2013

(65) Prior Publication Data

US 2015/0048848 A1 Feb. 19, 2015

(51) Int. Cl.
  *G01L 27/00* (2006.01)
  *G01R 27/26* (2006.01)
  *G01L 9/00* (2006.01)

(52) U.S. Cl.
  CPC .......... *G01R 27/2605* (2013.01); *G01L 9/0072* (2013.01); *G01L 27/002* (2013.01); *G01L 27/005* (2013.01); *B81B 2201/0264* (2013.01)

(58) Field of Classification Search
  USPC .......... 324/548, 658–690; 257/532, E29.324, 257/E21.002, E29.342, E21.008, E21.499; 361/270; 345/173–178; 307/109
  See application file for complete search history.

(56) References Cited

U.S. PATENT DOCUMENTS

| | | | |
|---|---|---|---|
| 6,012,336 A * | 1/2000 | Eaton et al. ..................... | 73/754 |
| 6,470,754 B1 | 10/2002 | Gianchandani | |
| 6,564,643 B1 * | 5/2003 | Horie et al. ..................... | 73/724 |
| 7,093,478 B2 | 8/2006 | Chau et al. | |
| 7,489,141 B1 | 2/2009 | Vermeire et al. | |
| 7,673,519 B1 * | 3/2010 | Fuhrmann et al. ............... | 73/718 |
| 2003/0015040 A1 * | 1/2003 | Ishio et al. ..................... | 73/718 |
| 2006/0066872 A1 | 3/2006 | Cummings et al. | |

* cited by examiner

*Primary Examiner* — Melissa Koval
*Assistant Examiner* — Nasima Monsur
(74) *Attorney, Agent, or Firm* — Charlene R. Jacobsen

(57) ABSTRACT

A test structure includes two capacitor structures, wherein one of the capacitor structures has conductor plates spaced apart by a cavity, and the other capacitor structure does not include a cavity. Methodology entails forming the test structure and a pressure sensor on the same substrate using the same fabrication process techniques. Methodology for estimating the sensitivity of the pressure sensor includes detecting capacitances for each of the two capacitor structures and determining a ratio of the capacitances. A critical dimension of the cavity in one of the capacitor structures is estimated using the ratio, and the sensitivity of the pressure sensor is estimated using the critical dimension.

14 Claims, 5 Drawing Sheets

TEST STRUCTURE AND METHODOLOGY FOR ESTIMATING SENSITIVITY OF PRESSURE SENSORS

TECHNICAL FIELD OF THE INVENTION

The present invention relates generally to microelectromechanical systems (MEMS) devices. More specifically, the present invention relates to estimating the sensitivity of a MEMS pressure sensor resulting from process variation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth. Capacitive-sensing MEMS device designs are highly desirable for operation in miniaturized devices due to their low temperature sensitivity, small size, and suitability for low cost mass production.

A microelectromechanical systems (MEMS) pressure sensor typically uses a pressure cavity and a membrane element, referred to as a diaphragm, that deflects under pressure. In some configurations, a change in the distance between two plates, where one of the two plates is the movable diaphragm, creates a variable capacitor to detect strain (or deflection) due to the applied pressure over an area. Process variation on critical design parameters, such as the width of a MEMS pressure sensor diaphragm, can affect the sensitivity of a pressure sensor. For example, a small difference in the width of a MEMS pressure sensor diaphragm can result in a large difference in sensitivity, relative to the predetermined nominal, or design, sensitivity for the pressure sensor. Accordingly, the sensitivity of each MEMS pressure sensor is typically calibrated individually. Individual calibration of MEMS pressure sensors undesirably increases costs associated with the pressure sensor and/or can introduce error in pressure measurements.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail a test structure and methodology for estimating a critical dimension, e.g., width, of a MEMS pressure sensor diaphragm and determining the sensitivity of a MEMS pressure sensor from that estimation. Such a test structure and methodology can reduce test costs, provide improved feedback for process control, and enable sensitivity estimation without imposing a physical stimulus trim signal.

Figure 1:
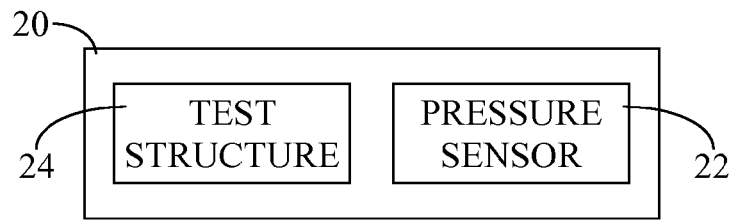
FIG. 1 shows a block diagram of a microelectromechanical systems (MEMS) sensor die that includes a MEMS pressure sensor and a test structure in accordance with an embodiment.

FIG. 1 shows a block diagram of a microelectromechanical systems (MEMS) sensor die 20 that includes a MEMS pressure sensor 22 and a test structure 24 in accordance with an embodiment. In general, die 20 is a block of material upon which a functional circuit is fabricated. In this case, pressure sensor 22 and test structure 24 are fabricated thereon in accordance with conventional and developing surface or bulk micromachining techniques. MEMS sensor die 20 may be implemented in a plurality of electronic systems such as in automotive systems, medical and industrial applications, and so forth. As will be discussed in significantly greater detail in connection with FIGS. 4-11, test structure 24 is formed on die 20 with pressure sensor 22 and is utilized to estimate the variation of a critical dimension of the pressure sensor relative to its nominal, or design, dimension. In this instance, the critical dimension is the width of a diaphragm for pressure sensor 22. Once this variation in the width from the design width is estimated, a sensitivity of pressure sensor 22 can be determined.

Figure 2:
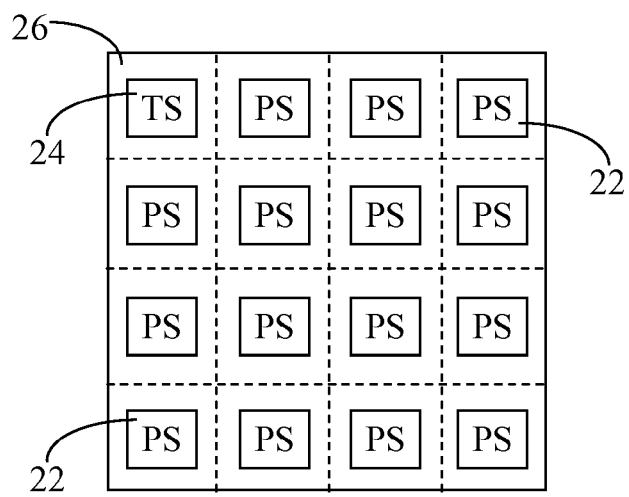
FIG. 2 shows a block diagram of a substrate that includes a plurality of pressure sensors and a test structure in accordance with another embodiment.

FIG. 2 shows a block diagram of a substrate 26 that includes a plurality of pressure sensors 22 and test structure 24 in accordance with another embodiment. In this scenario, a single test structure 24 (labeled TS) may be associated with multiple pressure sensors 22 (labeled PS) all of which are formed on the same substrate 26 using the same process techniques. The estimate of the variation of the critical dimension determined via test structure 24 can be utilized to determine the sensitivity of each of pressure sensors 22 formed on substrate 26. Test structure 24 will be described in detail in connection with FIGS. 7-9

Figure 3:
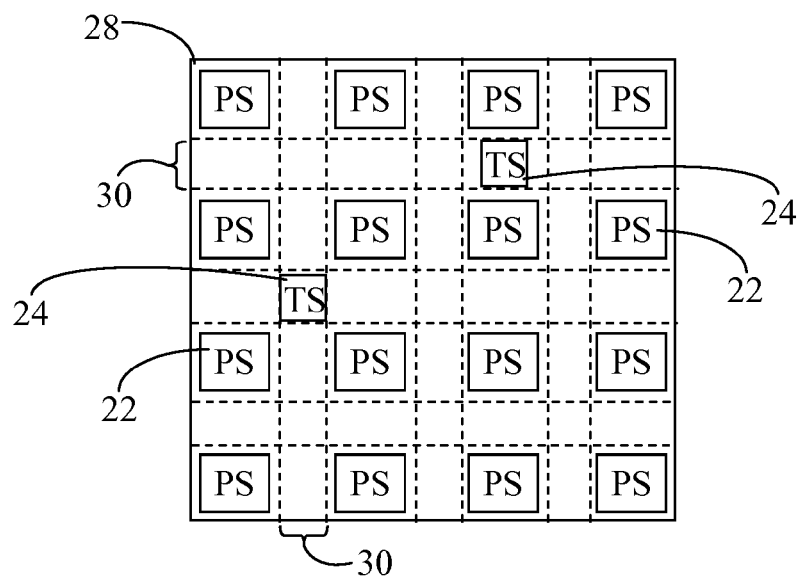
FIG. 3 shows a block diagram of a substrate that includes a plurality of pressure sensors and test structures in accordance with yet another embodiment.

FIG. 3 shows a block diagram of a substrate 28 that includes a plurality of pressure sensors 22 and one or more test structures 24 in accordance with yet another embodiment. In this scenario, one or more test structures 24 (labeled TS) are associated with multiple pressure sensors 22 (labeled PS). However, test structures 24 are formed on substrate 28 within inactive regions 30 (delineated by dashed lines) of substrate 28. Inactive regions 30 are those locations on substrate 28 that do not include the active circuitry for pressure sensors 22. For example, inactive regions 30 may be the die streets where a saw can safely cut substrate 28 without damaging the active circuitry of pressure sensors 22 during a singulation or dicing process.

Test structures 24 may be utilized prior to singulation to estimate the sensitivity of pressure sensors 22. Test structures 24 may no longer be utilized following sensitivity estimation.

Therefore, any damage they might sustain during a singulation process may be immaterial. Accordingly, space savings can be achieved by locating test structures 24 within inactive regions 30 without compromising the ability to utilize test structures 24 prior to singulation for estimating the sensitivity of pressure sensors 22.

Figure 4:
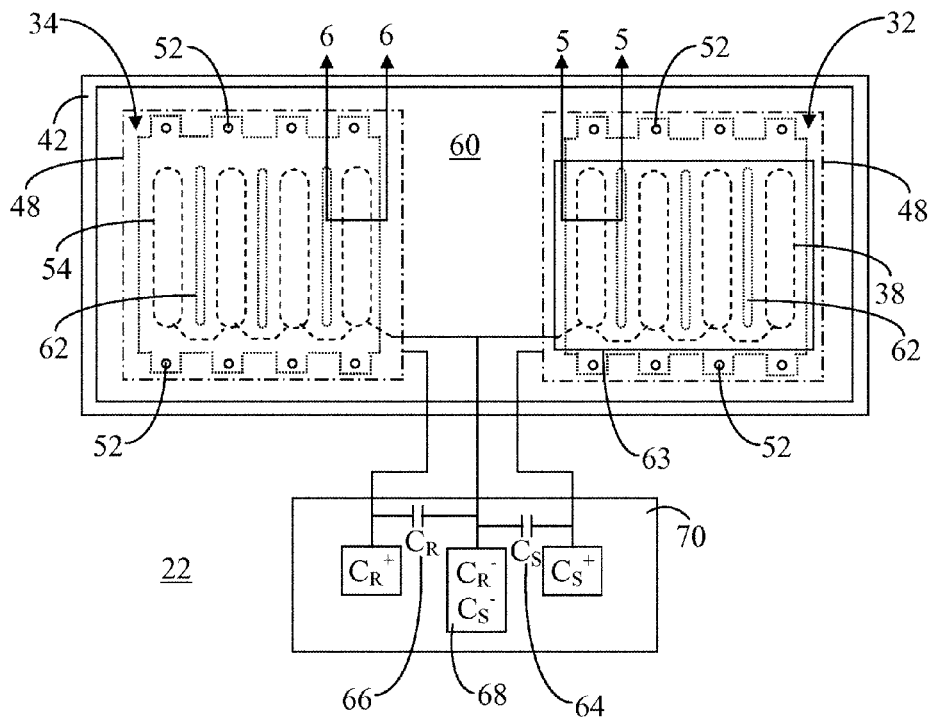
FIG. 4 shows a simplified top view of an exemplary pressure sensor.
Figure 5:
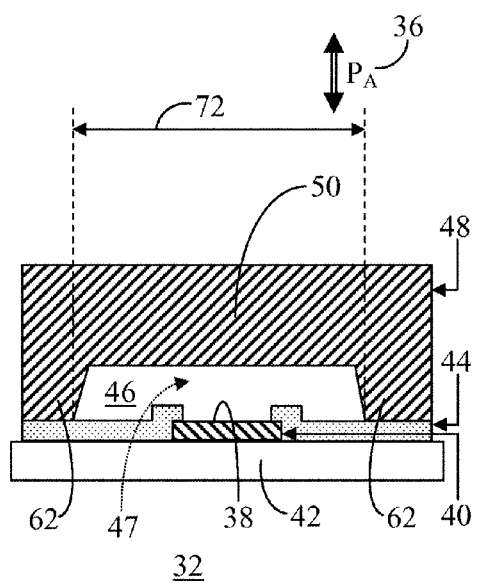
FIG. 5 shows a side sectional view of a sense cell of the pressure sensor along section lines 5-5 of FIG. 4.
Figure 6:
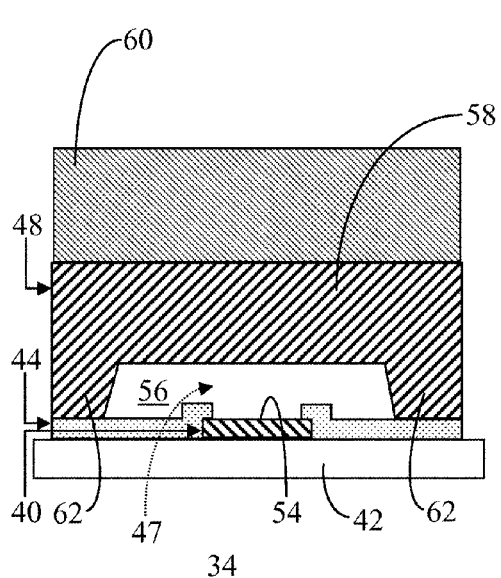
FIG. 6 shows a side sectional view of a reference cell of the pressure sensor along section lines 6-6 of FIG. 4.

Referring to FIGS. 4-6, FIG. 4 shows a simplified top view of an exemplary pressure sensor 22, FIG. 5 shows a side sectional view of a sense cell 32 of pressure sensor 22 along section lines 5-5 of FIG. 4, and FIG. 6 shows a side sectional view of a reference cell 34 of pressure sensor 22 along section lines 6-6 of FIG. 4. In general, sense cell 32 is sensitive to ambient pressure 36, represented by a bi-directional arrow and labeled $P_A$ in FIG. 6. Conversely, reference cell 34 is largely insensitive to ambient pressure 36.

Sense cell 32 includes one or more sense electrodes 38 formed in a structural layer 40 on a substrate 42 using the conventional operations of deposition, patterning, and etching. It should be noted that the substrate discussed in connection with FIGS. 4-6 and 7-9 is referred to as substrate 42. However, substrate 42 may be die 20 (FIG. 1), substrate 26 (FIG. 2), or substrate 28 (FIG. 3) in accordance with any of the structural embodiments discussed above. FIGS. 4-9 are illustrated using various shading and/or hatching to distinguish the different elements produced within the structural layers of the devices, as will be discussed below. These different elements within the structural layers may be produced utilizing current and upcoming surface micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

An insulating layer, for example, a nitride layer 44 is formed overlying at least portions of sense electrodes 38 and any exposed regions of the underlying substrate 42. Sense cell 32 includes a pressure cavity 46 that may be formed by the conventional processes of deposition, patterning, and etching of a sacrificial layer 47, such as, polysilicate glass (PSG). After sacrificial layer 47 is suitably formed, another structural layer 48 is formed overlying sacrificial layer 47 and any exposed regions of the underlying nitride layer 44 and/or substrate 42. Structural layer 48 is processed to form one or more diaphragms 50 of sense cell 32 that are spaced apart from the underlying sense electrodes 38 by pressure cavity 46. Thereafter, sacrificial layer 47 within pressure cavity 46 may be removed via etch openings 52 per conventional processes. Sacrificial layer 47 is no longer present within cavity 46 in the fabricated sense cell 32 illustrate in FIG. 5. Hence a dotted line is directed from reference numeral 47 to the interior of cavity 46 to represent a location where sacrificial layer 47 was present prior to its removal.

Reference cell 34 is similar to sense cell 32. Accordingly, reference cell 34 includes one or more reference electrodes 54 formed in structural layer 40 on substrate 42, nitride layer 44 formed overlying at least portions of reference electrodes 54 and any exposed regions of the underlying substrate 42, and a vacuum cavity 56. Structural layer 48 is processed as discussed above and sacrificial material 47 within pressure cavity 56 is removed to form one or more diaphragms 58 spaced apart from reference electrodes 54 by vacuum cavity 56. Again, sacrificial layer 47 is no longer present within cavity 56 in the fabricated reference cell 34 illustrate in FIG. 6. Hence a dotted line is directed from reference numeral 47 to the interior of cavity 56 to represent a location where sacrificial layer 47 was present prior to its removal. A cap layer 60 is formed in contact with diaphragms 58. Cap layer 60 may be a relatively thick layer of, for example, tetraethyl orthosilicate (TEOS), which makes diaphragms 58 largely insensitive to pressure. As such, diaphragms 58 may be referred to hereinafter as reference electrodes 58.

In FIG. 4, elongated ovals illustrated using a dashed pattern represent electrodes 38 for sense cell 32. Dashed elongated ovals represent electrodes 54 for reference cell 34 as well. Additionally, a dotted pattern that includes elongated ovals as well as a generalized rectangular shape surrounding electrodes 38 represents those portions of structural layer 48 (see also FIGS. 5-6) that couple to nitride layer 44 such as, for example, side walls 62 of pressure cavities 46, 56. That is, side walls 62 (see also FIGS. 5-6) are the portions of structural layer 48 that couple to nitride layer 44 so as to form the individual pressure cavities 46, 56 of respective sense and reference cells 32, 34. Squares illustrated by a dash-dot pattern in FIG. 4 represent the outer edge of the capacitor plate, i.e., layer 48 in FIGS. 5 and 6, which includes diaphragms 50, 58 (best seen in FIGS. 5-6) of sense and reference cells 32, 34, respectively. It should be recalled that cap layer 60 is not formed over diaphragms 50 so that diaphragms 50 are sensitive to pressure 36. Accordingly, a square 63 illustrated in a solid pattern in FIG. 4 represents a window, or absence of cap layer 60 so that diaphragms 50 are exposed to pressure 36. These variously patterned shapes do not represent the size of each element or feature relative to one another, but instead represent the stacked relationship of each of the elements or features.

In the top view of pressure sensor 22 shown in FIG. 4, each of sense cell 32 and reference cell 34 is illustrated as having four pressure cavities 46, 56, four electrodes 38, 54 formed on substrate 42, and four diaphragm/electrodes 50/58 spaced apart from electrodes 38, 54 by respective pressure cavities 46, 56. However, it should be understood by those skilled in the art that sense cell 32 and reference cell 34 may have any suitable quantity of cavities and their associated diaphragms/electrodes. Additionally, pressure sensor 22 may include other features on die 20 such as shield lines, a guard ring, and so forth that are not included in FIG. 4 for simplicity of illustration.

In general, sense cell 32 forms a capacitor between each of diaphragms 50 and sense electrodes 38. That is, a sense capacitance 64, $C_S$, is formed between diaphragms 50 and sense electrodes 38 (i.e., the difference between $C_S^+$ and $C_S^-$) that varies in response to pressure 36. Reference cell 34 also forms a capacitor between each of electrodes 58 and reference electrodes 54. Thus, a reference capacitance 66, $C_R$, is formed between electrodes 58 and reference electrodes 54 (i.e., the difference between $C_R^+$ and $C_R^-$) that does not vary in response to pressure 36 due to the presence of cap layer 60. In an embodiment, sense electrodes 38 and reference electrodes 54 are interconnected conductors that form a common node 68 between each of sense cell 32 and reference cell 34. A control circuit 70 is configured to measure the ratio of sense capacitance 64 to reference capacitance 66 (i.e., $C_S/C_R$). Higher pressure 36 increases sense capacitance 64, $C_S$, but has little effect on reference capacitance 66, $C_R$. Therefore the ratio of sense capacitance 64 to reference capacitance 66 (i.e., $C_S/C_R$) increases as pressure 36 increases. This value can be converted into a measure indicative of pressure 36.

In the illustrated embodiment, a critical dimension of sense cell 32 is a width 72 of diaphragm 50. In order to obtain a desired sensitivity, a predetermined design value is established for width 72. However, process variation during, for example, deposition/patterning/etching of the sacrificial layer and/or during the release process where the sacrificial material within cavities 46 and 56 is removed can result in angled sidewalls and/or other dimensional variations that cause width 72 of diaphragm 50 to be greater than or less than the predetermined design value. The potential variation in width 72 can cause a shift in the sensitivity of pressure sensor 22, reflected as a shift in capacitance. As will be discussed in detail below, test structure 24 is implemented in connection with pressure sensor 22 to estimate the fabricated width 72 of diaphragm 50 which may vary from a predetermined design value due to process variation during fabrication and to subsequently estimate the sensitivity of pressure sensor 22 in response to any process variation.

Pressure sensor 22 is illustrated with generally rectangular diaphragms having width 72 that is less than a length of the rectangular diaphragms. However, the diaphragms need not be rectangular, but may instead be other shapes (e.g., squares, circles, multi-sided elements, and so forth) with which test structure 24 may be implemented in order to estimate a critical dimension of the particular diaphragm.

Figure 7:
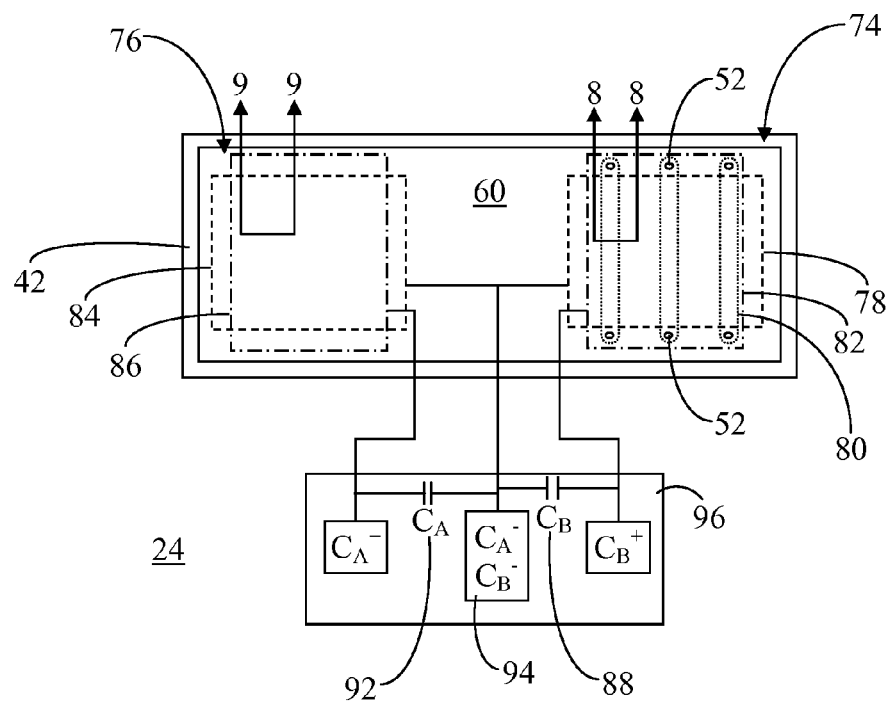
FIG. 7 shows a simplified top view of a test structure in accordance with an embodiment.
Figure 8:
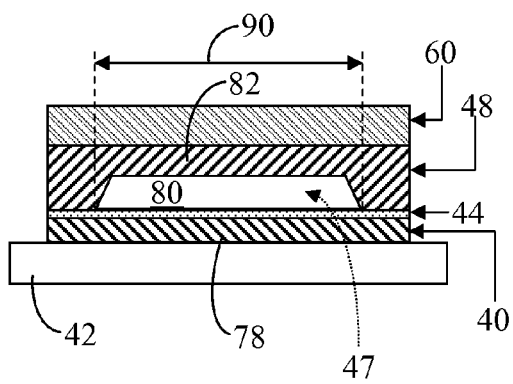
FIG. 8 shows a side sectional view of a capacitor structure of the test structure along section lines 8-8 of FIG. 7.
Figure 9:
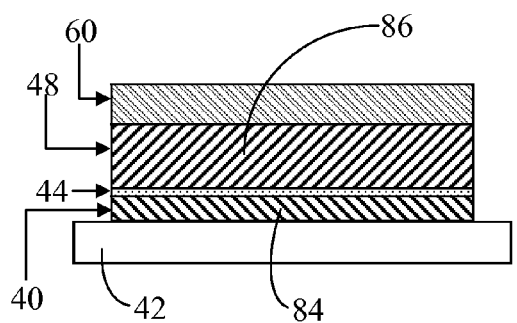
FIG. 9 shows a side sectional view of another capacitor structure of the test structure along section lines 9-9 of FIG. 7.

Referring now to FIGS. 7-9, FIG. 7 shows a simplified top view of test structure 24 in accordance with an embodiment, FIG. 8 shows a side sectional view of a capacitor structure 74 of test structure 24 along section lines 8-8 of FIG. 7, and FIG. 9 shows a side sectional view of another capacitor structure 76 of test structure 24 along section lines 9-9 of FIG. 7. In general, each of capacitor structures 74, 76 are fixed capacitors, neither of which is sensitive to ambient pressure 36 (FIG. 6). However, capacitor structure 76 is designed such that its capacitance has very little dependence on any process variation, whereas capacitor structure 74 is designed such that its capacitance is dependent upon process variation of the critical dimension, e.g., a width of a cavity. Values of these capacitances can be ultimately be used to estimate the sensitivity of pressure sensor 22 (discussed below).

Capacitor structure 74 includes a conductive plate 78 formed in structural layer 40 on substrate 42 using the conventional operations of deposition, patterning, and etching. Nitride layer 44 is formed overlying at least a portion of conductive plate 78 and any exposed regions of the underlying substrate 42. Capacitor structure 74 includes at least one pressure cavity 80 that may be formed by the conventional processes of deposition, patterning, and etching of sacrificial layer 47, such as, polysilicate glass (PSG). After sacrificial layer 47 is suitably formed, structural layer 48 is formed overlying sacrificial layer 47 and any exposed regions of the underlying nitride layer 44 and/or substrate 42. The portion of structural layer 48 overlying cavity 80 forms another conductive plate 82 of capacitor structure 74. Sacrificial layer 47 is removed so that conductive plate 82 is spaced apart from conductive plate 78 by cavity 80, and cap layer 60 is formed in contact with conductive plate 82.

Capacitor structure 76 is similar to capacitor structure 74, with the exception being that capacitor 76 does not include cavity 80 (FIG. 8). Accordingly, capacitor structure 76 includes a conductive plate 84 formed in structural layer 40 on substrate 42 and the electrically insulating nitride layer 44 formed overlying conductive plate 84. Structural layer 48 is formed in contact with the electrically insulating nitride layer 44 without an intervening sacrificial layer. The portion of structural layer 48 overlying conductive plate 84 forms another conductive plate 86 of capacitor structure 76 with nitride layer 44 being positioned between conductive plates 84 and 86 in lieu of cavity 80. Cap layer 60 is formed in contact with conductive plate 86.

In the top view of test structure 24 in FIG. 7, a rectangle illustrated by a dashed pattern represents conductor plate 78 of capacitor structure 74. Likewise, a rectangle illustrated by a dashed pattern represents conductor plate 84 of capacitor structure 76 as well. Additionally, a rectangle illustrated by a dash-dot pattern represents conductor plate 82 of capacitor structure 74, and a rectangle illustrated by a dash-dot pattern represents conductor plate 86 of capacitor structure 76. Ovals represented by a dotted pattern represent multiple cavities 80 of capacitor structure 74. These variously patterned squares do not represent the size of each element or feature relative to one another, but instead represent the stacked relationship of each of the elements or features.

In general, a capacitance 88, $C_B$ (i.e., the difference between $C_B^+$ and $C_B^-$), is formed between conductor plates 78 and 82 of capacitor structure 74. The value of capacitance 88, $C_B$, is dependent upon a critical dimension, i.e., a width 90 of cavity 80. A capacitance 92, $C_A$ (i.e., the difference between $C_A^+$ and $C_A^-$), is formed between conductor plates 84 and 86 of capacitor structure 76. The value of capacitance 92 is independent of a critical dimension of a cavity since capacitor structure 76 does not include a cavity. In an embodiment, conductor plates 78 and 84 are interconnected conductors that form a common node 94 between each of capacitor structures 74 and 76.

A control circuit 96 is configured to measure the ratio of capacitance 88 to capacitance 92 (i.e., $C_B/C_A$). In an embodiment, cavity 80 of capacitor structure 74 is formed utilizing the same fabrication processes as for cavities 46, 56 (FIGS. 5-6) of sense and reference cells 32, 24 (FIG. 5-6) of pressure sensor 22 (FIG. 4). Accordingly, any process variation of widths 72 (FIG. 5-6) will also proportionally occur during fabrication of cavity 80 of capacitor structure 74. Accordingly, the ratio of capacitance 88 to capacitance 92 (i.e., $C_B/C_A$) is proportional to width 72, i.e., the critical dimension, and can be utilized to ultimately estimate the sensitivity of pressure sensor 22 (FIG. 1) resulting from process variation, as will be discussed in connection with FIG. 11.

Figure 10:
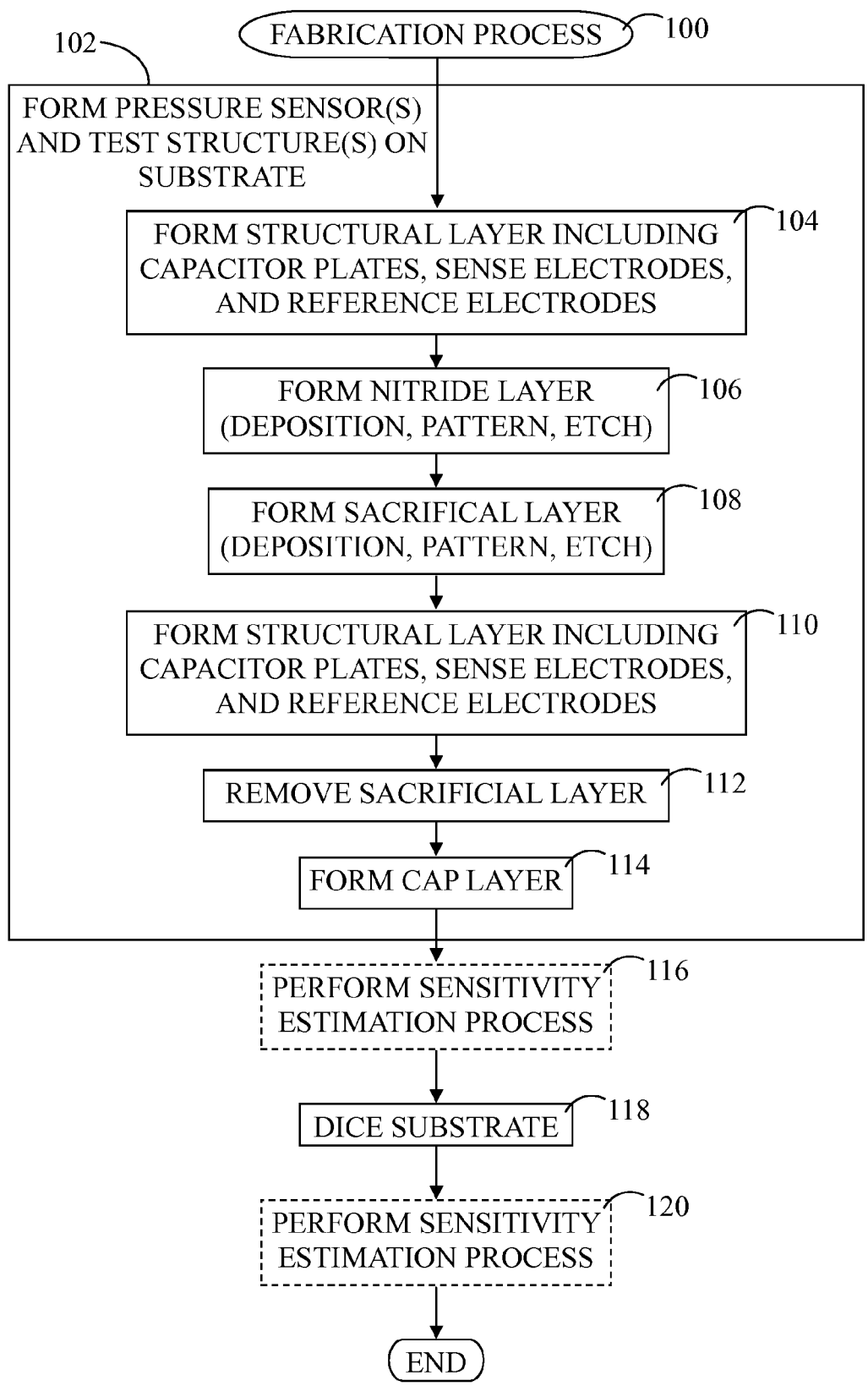
FIG. 10 shows a flowchart of a fabrication process in accordance with another embodiment.

FIG. 10 shows a flowchart of a fabrication process 100 in accordance with another embodiment. In an embodiment, pressure sensor 22 and test structure 24 are formed concurrently on a common substrate in at least one of the structural configurations of FIGS. 1-3. Accordingly, any process variation that affects width 72 of cavities 46, 56 of sense cell 32 or reference cell 34, will also affect width 90 of cavity 80 of capacitor structure 74. Pressure sensor 22 and test structure 24 may be fabricated using the surface micromachining processes of thin film deposition, patterning, and etching in order to form elements in structural layers and sacrificial layers that are used to define gaps, or cavities, between the elements in the structural layers.

Fabrication process 100 begins with a series of operations generally referred to as a subprocess 102 of forming one or more pressure sensors 22 and one or more test structures 24 on the same substrate 42 (FIG. 4).

Operations of forming subprocess 102 include a task 104 at which structural layer 40 (FIG. 5) is formed on substrate 42 to include capacitor plates 78, 84 of capacitor structures 74, 76 (FIGS. 8-9), sense electrodes 38 of sense cells 32 (FIG. 6), and reference electrodes 54 of reference cells 34 (FIG. 5). The structures in structural layer 40 may be formed utilizing known and upcoming deposition, patterning, and etching processes. Subprocess 102 continues with a task 106 in which nitride layer 44 (FIG. 5) is suitably formed over structural layer 40 utilizing, for example, deposition, patterning, and etching processes.

Following task 106, a task 108 is performed. At task 108, sacrificial layer 47 (represented in FIGS. 5, 6, and 8) is formed over nitride layer 44 in accordance with known deposition, patterning, and etching processes. Subprocess 102 continues with a task 110. At task 110, structural layer 48 (FIG. 5) is formed to include capacitor plates 82, 86 of capacitor structures 74, 76 (FIGS. 8-9), diaphragms 50 of sense cells 32 (FIG. 5), and reference electrodes 58 of reference cells 34 (FIG. 6).

Next at a task 112, the sacrificial layer 47 may be removed via etch openings 52 (FIGS. 4 and 7) as known to those skilled in the art. Thus, following task 112, cavities 46 of sense cells 32 (FIG. 5), cavities 56 of reference cells 34 (FIG. 6), and cavities 80 of capacitor structures 74 (FIG. 8) remain. Subprocess 102 continues with a task 114. At task 114, cap layer 60 (FIG. 5) is formed by, for example, deposition of TEOS so that it is in contact with reference electrodes 58 and capacitor plates 82 and 86. Following task 114, the fabrication of pressure sensor 22 (FIG. 1) and test structure (24) is generally complete. However, those skilled in the art will recognize that various additional operations may be performed to fabricate pressure sensor 22 and test structure 24 on the same substrate. These various additional operations are omitted herein for clarity of illustration.

Following task 114 of subprocess 102, fabrication process 100 may continue with a task 116. At task 116, a sensitivity estimation process may be performed. The sensitivity estimation process will be discussed in detail in connection with FIG. 11. The task block for task 116 is illustrated by dashed lines to indicate that it may or may not be performed immediately following the execution of subprocess 102. In some embodiments, task 116 may be performed immediately following subprocess 102 and prior to a subsequent dicing, or singulation, task 118 when one or more test structures 24 is formed on a substrate with multiple pressure sensors such as in shown in FIGS. 2-3. If task 116 is performed prior to dicing task 118 at probe testing, the determined values could be saved in a database (not shown) which can then be retrieved at final testing.

Accordingly, following subprocess 102 or task 116, fabrication process 100 continues with task 118. At task 118, substrate 42 in the form of, for example, a wafer is diced into MEMS sensor die 20 (FIG. 1) that includes both a pressure sensor 22 and a test structure 24 or into individual pressure sensors 22 (FIGS. 2-3).

Following task 118, a task 120 may be performed at which the sensitivity estimation process (FIG. 11) may be performed. The task block for task 120 is again illustrated by dashed lines to indicate that it may or may not be performed immediately following the execution of dicing task 118. In some embodiments, task 120 may be performed following dicing task 118 at final test in lieu of, or in addition to, task 116 in accordance with particular text requirements and procedures. Following task 120, fabrication process 100 ends.

Figure 11:
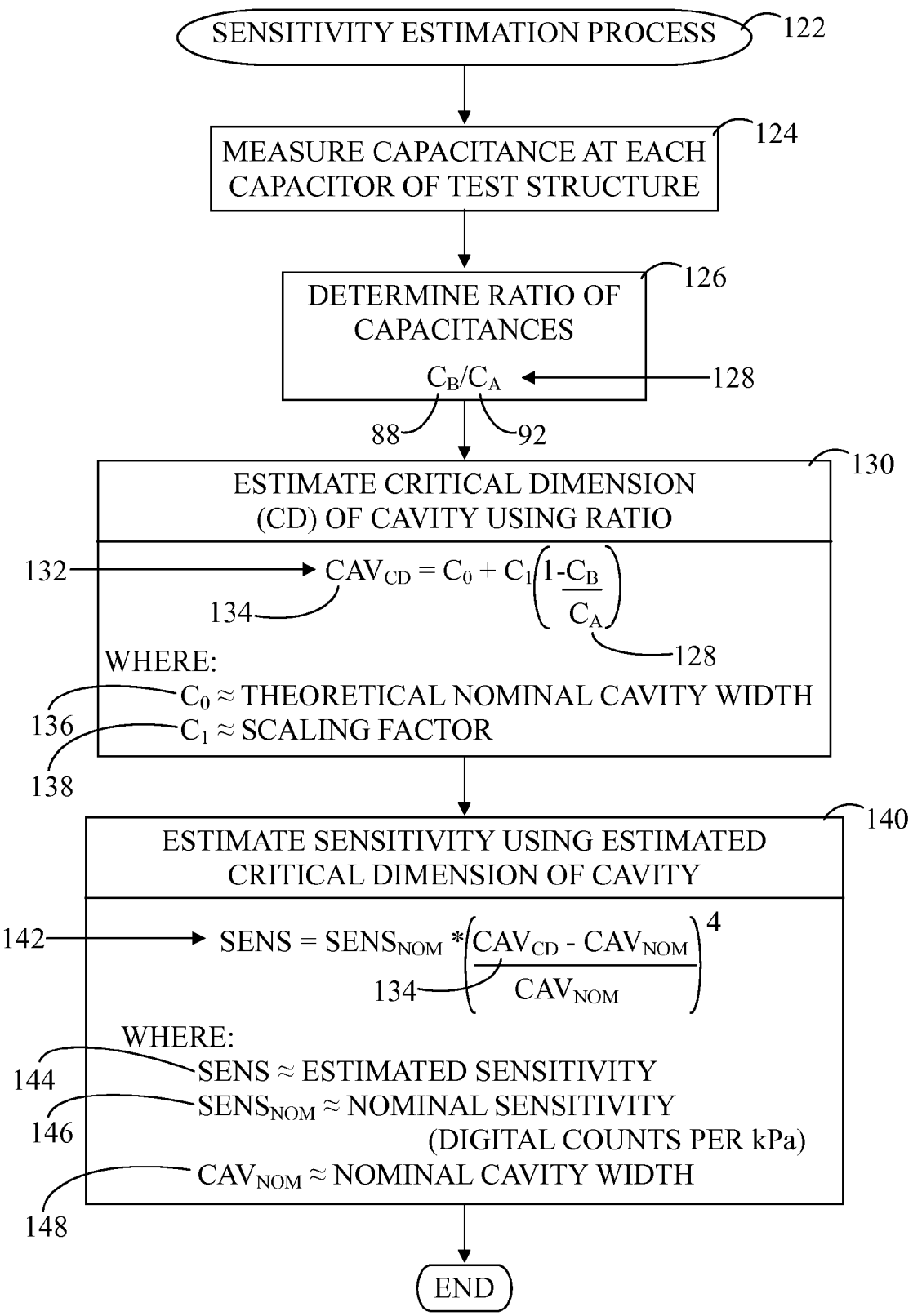
FIG. 11 shows a flowchart of a sensitivity estimation process in accordance with another embodiment.

FIG. 11 shows a flowchart of a sensitivity estimation process 122 in accordance with another embodiment. Sensitivity estimation process 122 may be performed in accordance with task 116 (FIG. 10) of fabrication process 100 (FIG. 10) prior to wafer dicing task 118. Alternatively, or in addition, sensitivity estimation process 122 may be performed in accordance with task 120 (FIG. 10) of fabrication process 100 following wafer dicing task 118. In general, sensitivity estimation process 122 determines the ratio of capacitance 88 of capacitor structure 74 to capacitance 92 of capacitor structure 76 (i.e., $C_B/C_A$) of test structure 24 (FIG. 7), and uses the ratio to estimate a critical dimension of cavity 80 (FIG. 9) of capacitive structure 74. The critical dimension is subsequently used to estimate a sensitivity of pressure sensor 22 (FIG. 1).

Sensitivity estimation process 122 begins with a task 124. At task 124, capacitance 88, $C_B$ (FIG. 7), at capacitor structure 74 (FIG. 7) and capacitance 92, $C_A$ (FIG. 7), at capacitor structure 76 (FIG. 7) are measured.

In response to task 124, sensitivity estimation process 122 continues with a task 126, a capacitance ratio 128 is determined as a ratio of capacitance 88 of capacitor structure 74 to capacitance 92 of capacitor structure 76 (i.e., $C_B/C_A$) of test structure 24 (FIG. 7). In general, a relatively high value for capacitance ratio 128 indicates a relatively narrow critical dimension, which indicates that pressure sensor 22 has a relatively narrow diaphragm 50 (FIG. 6) and therefore relatively low sensitivity. Conversely, a relatively low capacitance ratio 128 indicates relatively high sensitivity.

Sensitivity estimation process 122 continues with a task 130. At task 130, the critical dimension, i.e., width 80 of capacitive structure 74 is estimated utilizing ratio 128. An exemplary equation 132 is provided with task 130 to demonstrate a relationship between ratio 128 and an estimated critical dimension 134, $CAV_{CD}$ of cavity 80 (e.g., width 90 shown in FIG. 8). Estimated critical dimension 134 is a function of a theoretical nominal cavity width 136, $C_0$, of cavity 80, a scaling factor 138, $C_1$, and ratio 128. If capacitance 88 is equal to capacitance 92, then ratio 128 will be equal to one. As such, estimated critical dimension 134 of cavity 90 will be equivalent to its theoretical nominal cavity width 136. If capacitance 88 is less than capacitance 92, then ratio 128 will be less than one. In this case, estimated critical dimension 134 will be greater than nominal cavity width 136. Scaling factor 138 controls how much larger estimated critical dimension 134 will be. Thus, scaling factor 138 is used to translate measured differences in capacitances to estimated critical dimension 134.

Following the estimation of critical dimension 134 at task 130, sensitivity estimation process 122 continues with a task 140, the sensitivity of pressure sensor 22 (FIG. 1) is estimated using estimated critical dimension 134, $CAV_{CD}$, of cavity 80. An exemplary equation 142 is provided with task 140 to demonstrate a relationship between estimated critical dimension 134, $CAV_{CD}$, and an estimated sensitivity 144, SENS, for pressure sensor 22. Estimated sensitivity 144 (in digital counts per kPa) is a function of a nominal design sensitivity 146, $SENS_{NOM}$, for pressure sensor 22 (in digital counts per kPa, determined empirically), estimated critical dimension 134, $CAV_{CD}$, and a nominal design critical dimension, $CAV_{NOM}$ 148 of cavity 80 (FIG. 9). The last term in exemplary equation 142 may be taken to the fourth power because sensitivity of diaphragm 50 (FIG. 6) tends to change as a function of width 72 (FIG. 6) to the fourth power. For example, if estimated critical dimension 134 is 110% of nominal cavity width 148, estimated sensitivity 144 will be $1.1^4$, or 146% of nominal design sensitivity 146. Following task 140, sensitivity estimation process 122 ends having provided an estimate of sensitivity of pressure sensors due to process variation that affects a critical dimension of the pressure sensors. Thus, estimated sensitivity 144 of pressure sensor 22 (FIG. 1) or a plurality of pressure sensors 22 (FIGS. 2 and 3) on the same substrate can be determined as a function of capacitance ratio 128 through execution of sensitivity estimation process 122

Exemplary equations 132 and 142 are provided herein for illustrative purposes. In practice, however, there may be deviations from the ideal that will call for nominal cavity width 136, scaling factor 138, nominal design sensitivity 146, and so forth to be empirically calculated rather than simply being based on the design values. There may also be additional terms added to compensate for higher order effects that are not in the theoretical models.

It is to be understood that certain ones of the process blocks depicted in FIGS. 10 and 11 may be performed in parallel with each other or with performing other processes. In addition, it is to be understood that the particular ordering of the process blocks depicted in FIGS. 10 and 11 may be modified, while achieving substantially the same result. Accordingly, such modifications are intended to be included within the scope of the inventive subject matter. In addition, although particular system configurations are described in conjunction with FIGS. 1-9, above, embodiments may be implemented in systems having other architectures, as well. These and other variations are intended to be included within the scope of the inventive subject matter.

An embodiment of a test structure comprises a first capacitor structure having a first conductor plate, a second conductor plate, and an electrical insulator layer interposed between and in contact with each of the first and the second conductor plates, the first capacitor structure producing a first capacitance. The test structure further comprises a second capacitor structure having a third conductor plate and a fourth conductor plate spaced apart by a cavity, the second capacitor structure producing a second capacitance, wherein a ratio of the second capacitance to the first capacitance is utilized to estimate a critical dimension of the cavity.

An embodiment of a method comprises forming a pressure sensor on a substrate, the pressure sensor including a sense cell having a first cavity, the first cavity being characterized by a width, and forming a test structure on the substrate. The test structure includes a first capacitor structure and a second capacitor structure, the first capacitor structure having a first conductor plate and a second conductor plate spaced apart by an electrical insulator layer, the first capacitor structure producing a first capacitance, and the second capacitor structure having a third conductor plate and a fourth conductor plate spaced apart by a second cavity, the second capacitor structure producing a second capacitance, wherein a ratio of the second capacitance to the first capacitance is utilized to estimate a critical dimension of the second cavity, and the critical dimension is utilized to estimate a sensitivity of the pressure sensor.

An embodiment of a method of determining a sensitivity of a pressure sensor comprises implementing a test structure, the test structure including a first capacitor structure and a second capacitor structure, the first capacitor structure having a first conductor plate and a second conductor plate spaced apart by an electrical insulator layer, and the second capacitor structure having a third conductor plate and a fourth conductor plate spaced apart by a cavity. The method further comprises detecting a first capacitance between the first and second conductor plates of the first capacitor structure, detecting a second capacitance between the third and fourth conductor plates of the second capacitor structure, and determining a ratio of the second capacitance to the first capacitance. A critical dimension of the cavity is estimated using the ratio, and the sensitivity of the pressure sensor is estimated using the critical dimension.

Thus, various embodiments of a test structure, a method of fabrication, and a method of estimating sensitivity of a pressure sensor using the test structure have been described. The test structure and methodology are implemented for estimating the critical dimension, i.e., width, of a MEMS pressure sensor diaphragm and determining the sensitivity of a MEMS pressure sensor from that estimated width. Such a test structure and methodology can reduce test costs, provide improved feedback for process control, and enable sensitivity estimation without imposing a physical stimulus trim signal.

While the principles of the inventive subject matter have been described above in connection with specific apparatus and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A test structure comprising:
   a first capacitor structure having a first conductor plate, a second conductor plate, and an electrical insulator layer interposed between and in contact with each of said first and said second conductor plates, said first capacitor structure producing a first capacitance; and
   a second capacitor structure having a third conductor plate and a fourth conductor plate spaced apart by a cavity, said second capacitor structure producing a second capacitance, wherein a ratio of said second capacitance to said first capacitance is utilized to estimate a critical dimension of said cavity, wherein said first and second capacitor structures are formed on a substrate upon which a pressure sensor is formed, said pressure sensor includes a sense cell having a sense cavity, said sense cavity is characterized by a width, said critical dimension is proportional to said width of said sense cavity, and said critical dimension is utilized to estimate a sensitivity of said pressure sensor.

2. A test structure as claimed in claim 1 wherein said ratio is proportional to said critical dimension.

3. A test structure as claimed in claim 1 wherein said first capacitor structure does not include a cavity.

4. A test structure as claimed in claim 1 further comprising a cap layer over said fourth conductor plate of said second capacitor structure.

5. A test structure as claimed in claim 1 wherein said first and second capacitor structures are formed on said substrate such that said first conductor plate is interposed between said substrate and said electrical insulator layer, and said third conductor plate is interposed between said substrate and said cavity.

6. A test structure as claimed in claim 1 wherein said pressure sensor includes a sense cell having a first electrode and a second electrode, said first electrode being formed in a first structural layer, said second electrode being formed in a second structural layer, and:
   said first and third conductor plates are formed in said first structural layer; and
   said second and fourth conductor plates are formed in said second structural layer.

7. A test structure as claimed in claim 1 wherein said substrate includes a single pressure sensor and said first and second capacitor structures are formed on said substrate in association with said single pressure sensor.

8. A test structure as claimed in claim 1 wherein said substrate includes a plurality of pressure sensors, said pressure sensor being one of said plurality of pressure sensors, and said test structure is a single test structure in association with said plurality of pressure sensors.

9. A test structure as claimed in claim 1 wherein said substrate includes a plurality of pressure sensors laterally separated from one another by inactive regions, and said test structure is formed on said substrate in one of said inactive regions.

10. A method comprising:
forming a plurality of pressure sensors on a substrate, each of said pressure sensors including a sense cell having a first cavity; and
forming only one test structure on said substrate, said test structure including a first capacitor structure and a second capacitor structure, said first capacitor structure having a first conductor plate, a second conductor plate, and an electrical insulator layer interposed between and in contact with each of said first and said second conductor plates, said first capacitor structure being formed without a cavity, and said second capacitor structure having a third conductor plate and a fourth conductor plate spaced apart by a second cavity.

11. A method as claimed in claim 10 wherein:
a sense electrode of said each of said pressure sensors, said first conductor plate of said first capacitor structure, and said third conductor plate of said second capacitor structure are formed in a first structural layer; and
a diaphragm of said each of said pressure sensors, said second conductor plate of said first capacitor structure, and said fourth conductor plate of said second capacitor structure are formed in a second structural layer.

12. A method as claimed in claim 10 wherein said forming said test structure includes forming a cap layer over said fourth conductor plate of said second capacitor structure, said cap layer making said second capacitor structure insensitive to pressure.

13. A method comprising:
forming a plurality of pressure sensors on a substrate, each of said pressure sensors including a sense cell having a first cavity;
forming a plurality of test structures on said substrate, each of said test structures including a first capacitor structure and a second capacitor structure,
said first capacitor structure having a first conductor plate, a second conductor plate, and an electrical insulator layer interposed between and in contact with each of said first and said second conductor plates, said first capacitor structure being formed without a cavity, and said second capacitor structure having a third conductor plate and a fourth conductor plate spaced apart by a second cavity; and
separating said substrate into a plurality of dies, each of said dies including one of said pressure sensors and one of said test structures.

14. A method comprising:
forming a plurality of pressure sensors on a substrate laterally separated from one another by inactive regions, each of said pressure sensors including a sense cell having a first cavity; and
forming a test structure on said substrate, said test structure including a first capacitor structure and a second capacitor structure, said first capacitor structure having a first conductor plate, a second conductor plate, and an electrical insulator layer interposed between and in contact with each of said first and said second conductor plates, said first capacitor structure being formed without a cavity, and said second capacitor structure having a third conductor plate and a fourth conductor plate spaced apart by a second cavity, wherein said forming said test structure includes forming said test structure on said substrate in one of said inactive regions.

* * * * *